United States Patent [19]

Kanaya et al.

[11] Patent Number: 5,450,037
[45] Date of Patent: Sep. 12, 1995

[54] POWER SUPPLYING CIRCUIT FOR SUPPLYING A VOLTAGE TO A DRIVING CIRCUIT

[75] Inventors: Masahito Kanaya, Ota; Takeshi Suzuki, Isesaki; Masakazu Ueno, Ota; Takahisa Makino, Oizumi; Yukinao Sakuma, Kiryu, all of Japan

[73] Assignee: Sanyo Electric Co., Ltd., Osaka, Japan

[21] Appl. No.: 268,012

[22] Filed: Jun. 29, 1994

[30] Foreign Application Priority Data

Jun. 30, 1993 [JP] Japan .................... 5-161933
Jan. 27, 1994 [JP] Japan .................... 6-007709
Jan. 28, 1994 [JP] Japan .................... 6-008750
Jan. 28, 1994 [JP] Japan .................... 6-008755

[51] Int. Cl.$^6$ .............. H03F 1/02; G05F 1/56
[52] U.S. Cl. ................... 330/297; 323/281
[58] Field of Search ........... 330/127, 267, 296, 297; 323/280, 281, 282

[56] References Cited

U.S. PATENT DOCUMENTS

| 4,087,759 | 5/1978 | Iwamatsu | 330/297 X |
| 4,626,767 | 12/1986 | Clappier et al. | 323/280 |
| 5,347,230 | 9/1994 | Noro | 330/297 |

FOREIGN PATENT DOCUMENTS 4-372212 12/1992 Japan .

*Primary Examiner*—Steven Mottola
*Attorney, Agent, or Firm*—Spensley Horn Jubas & Lubitz

[57] ABSTRACT

A gradient detecting unit detects the gradient in the output of a driven circuit. An offset voltage generating unit generates an offset voltage in response to an output of a driven circuit as well as the gradient detected by the gradient detecting unit. The gradient in the output of the driven circuit is increased as the change thereof is more abrupt and decreased as the change thereof is more gentle. For example, if the detected gradient is added to the normal offset voltage to form an offset voltage, the offset voltage can follow the changes in the output of the driven circuit to supply a proper supply voltage to the driven circuit.

16 Claims, 11 Drawing Sheets

Vi : INPUT SIGNAL
Vo : OUTPUT SIGNAL

POWER SUPPLYING CIRCUIT FOR SUPPLYING A VOLTAGE TO A DRIVING CIRCUIT

BACKGROUND OF THE INVENTION

1. Field of the Invention

The present invention relates to a power supply circuit, amplification circuit and composite (hybrid) integrated circuit system, and more particularly to improvements in such circuits for increasing the efficiency of an audio amplifier.

2. Description of the Prior Art

Audio amplifiers according to the prior art will now be described with reference to FIGS. 1 through 8. In prior art audio amplifiers, increasing efficiency has been an outstanding problem.

The audio amplifiers according to the prior art generally used a circuit such as that shown in FIG. 1. This circuit includes a push-pull circuit defined by the final stage transistors Q1 and Q2. An audio signal from the preceding stage (which is normally a preamplifier) is inputted into the transistors Q1 and Q2 at their base. The transistors Q1 and Q2 amplify such an audio signal to drive a loudspeaker SP through power from positive and negative power sources (+Vcc, −Vcc).

In such an arrangement, the final stage transistors Q1 and Q2 are driven respectively by the positive and negative supply voltages (+Vcc, −Vcc), the magnitudes of which can fetch the maximum output at all times. If the level of the audio signal inputted thereinto is relatively low, therefore, it has a disadvantage in that the power loss may be increased in the final stage transistors Q1 and Q2.

In order to avoid such a problem, there has been proposed a PWM (Pulse Width Modulation) amplifier such as is shown in FIG. 2. Such a PWM amplifier is adapted to input an audio signal from a preamplifier into a PWM circuit 1, to prepare a PWM signal having a duty depending on the signal level in the waveform of the audio signal at each point, and to drive MOS type transistors Q10 and Q20 defining an output stage CMOS inverter for switching supply power from positive and negative power sources (+Vcc, −Vcc) to a loudspeaker SP.

Such an arrangement can improve the efficiency of the system since the MOS type transistors Q10 and Q20 are switchingly driven to prolong the off-time period in the transistors Q10 and Q20 when the level of the input audio signal is relatively low. However, the amplifying circuit of FIG. 2 must include a low-pass filter circuit 2 inserted upstream of the loudspeaker SP to demodulate the PWM signal from the transistors Q1 and Q2 into an audio signal; the low-pass filter comprising a coil L and a capacitor C. Therefore, the PWM amplifier cannot follow the sharp rising to the larger amplitude of the audio input signal since the rise speed (slew rate) in the amplifier is too slow. Since the carrier components in the PWM signal are not completely removed and will be radiated from the output of the amplifying circuit toward the circumference through the signal line connected to the loudspeaker SP, there occurs a problem in that the radiated carrier components adversely affect peripheral instruments, by, for instance, wave disturbance.

For the same purpose, there has also been proposed a circuit such as is shown in FIG. 3. Such a circuit is adapted to amplify an audio signal through a power amplifier 8 comprising a preamplifier 3 and transistors Q1 and Q2 which define a final stage push-pull circuit. The supply voltages (+Vc, −Vc) of the transistors Q1 and Q2 vary depending on the state of the amplified signal.

On operation, an offset voltage is formed by superimposing a constant voltage from an offset power source 4 over the signal PS amplified by the preamplifier 3 and the power amplifier 8. The offset voltage is then inputted into one input of a comparator 6. At the same time, the other input of the comparator 6 receives a supply voltage (+Vc) which is the output voltage of a chopper power source 7.

The comparator 6 compares the offset voltage with the supply voltage (+Vc); the resulting output thereof is used to energize the chopper power source 7 so that the supply voltage (+Vc) will follow the offset voltage.

To actually realize such an operation, a circuit such as is shown in FIG. 4 can be used. The circuit includes a constant voltage generating circuit 9 for maintaining a constant base potential at a transistor Q3, which is a source of constant current supply. Thus, a constant collector current (Ic) flows from the transistor Q3 so that the comparator 6 will also be supplied with a constant current from a transistor Q4.

As the amplified signal PS, which is the output of the power amplifier, is inputted into the base of a transistor Q5 which defines the input of the offset power source 4, the emitter potential in the transistor Q5 varies depending on the magnitude of the amplified signal PS. As a result, the potential at a point A in FIG. 4 becomes equal to a potential difference at a resistor R0 or a product of the collector current Ic of the transistor Q3 and the resistance R0 plus the emitter potential of the transistor Q5.

Therefore, the potential at the point A in FIG. 4 becomes equal to an offset voltage obtained by adding the constant potential difference at the resistor R0 to the amplified signal PS. This offset voltage will then be inputted into the input of the comparator and compared with the supply voltage (+Vc) which is the output of the chopper power source.

If the supply voltage (+Vc) is lower than the offset voltage, the output of the comparator 6 becomes a high level so that a switching element SW in the chopper power source will be turned on to increase the supply voltage (+Vc). If the supply voltage (+Vc) is higher than the offset voltage, the output of the comparator 6 becomes a low level so that the switching element SW in the chopper power source will be turned off to decrease the supply voltage (+Vc). Therefore, the supply voltage (+Vc) will follow the offset voltage over which a constant voltage is superimposed, as shown in FIG. 5.

In such a manner, the supply voltages (+Vc, −Vc) can be reduced when the input level is lower while the supply voltages (+Vc, −Vc) can be increased when the input level is higher. Consequently, the power loss in the final stage transistors Q1 and Q2 can be controlled to improve the efficiency when the input level is lower.

However, the audio amplifiers shown in FIGS. 3 and 4 raise the following problems.

As an amplified signal ZS having its magnitude substantially equal to the positive power supply (+Vcc) for driving the power supply unit is inputted into the base of the transistor Q5 in such a circuit arrangement as shown in FIG. 4, the potential at the point A in FIG. 4 reaches the base potential in the transistor Q3 through addition of the potential difference across the resistor R0 to this larger amplified signal ZS. Thus, the transistor Q3 will be saturated to clip the offset voltage with the base potential in the transistor Q3.

As a result, the transistors Q3 and Q4 respectively supplying the constant currents to the offset power source 4 and comparator 6 will not operate in the normal manner. The offset power source 4 and comparator 6 become inoperative. Thus, the power amplifier cannot accommodate itself to an amplified signal ZS which is substantially equal to the positive supply power (+Vcc). This raises a problem in that the dynamic range of the amplifier cannot be sufficiently secured.

Furthermore, if the amplified signal rises sharply in such a circuit as shown in FIG. 3, the power supply to the transistors Q1 and Q2 will not be able to follow the sharp rising of the amplified signal.

It is further shown in FIG. 6 that the output of the chopper power source follows the offset voltage generated by half-wave clipping the amplified signal. However, the output of the chopper power source requires an abrupt change of voltage when the amplified signal varies across the ground level. Such a change of voltage becomes more abrupt as the amplitude of the amplified signal becomes larger and as the frequency becomes higher. However, the output of the chopper power source includes a filter circuit comprising a choke coil and a capacitor, which determines the limit of the follow-up to the offset voltage. With the abrupt change of voltage, the output of the chopper power source cannot follow the offset voltage so the output of the amplifier may be clipped within a time zone (HT) in which there is a distortion as shown in FIG. 6.

Further, one of the transistors defining the output stage of the amplifier which has a polarity opposite to that of the directed signal (for example, a transistor Q1 of FIG. 3 toward the negative side of which the amplified signal is directed) does not substantially supply current to a load. At this time, the offset voltage becomes a very low constant voltage, as shown in FIG. 6. If the audio signal is of high-frequency, however, the energy accumulated in the choke coil and capacitor will not be fully consumed as the amplified signal reaches its peak. As shown in FIG. 7, therefore, the output of the chopper power source will include a residual voltage even if the amplified signal is directed to the opposite side. Since such a residual voltage depends on the frequency of the amplified signal, the phase relative to the aforementioned HT signal will vary depending on the frequency of the amplified signal.

In such a manner, the circuit of the prior art raises a further problem in that as the amplified signal abruptly varies, the voltage of the chopper power source cannot follow it. This results in clipping of the amplified signal with a phase depending on the frequency of the amplified signal.

SUMMARY OF THE INVENTION

The present invention provides a power supply circuit for supplying a supply voltage to a driven circuit, comprising:

(1) a gradient detecting unit for detecting a gradient in the output of said driven circuit;

(2) an offset voltage generating unit responsive to the gradient detected by said gradient detecting unit and also to the output of said driven circuit for generating an offset voltage; and (3) a voltage supply unit for supplying a supply voltage following the offset voltage generated by said offset voltage generating unit to said driven circuit.

Thus, the gradient detecting unit detects the gradient in the output of the driven circuit. The offset voltage generating unit generates the offset voltage in response to the output of the driven circuit as well as the gradient detected by the gradient detecting unit. The gradient in the output of the driven circuit is increased as the change in the output is more abrupt and decreased as the change in the output is more gentle. If the detected gradient is added to the normal offset voltage to form an offset voltage, the offset voltage can follow any changes in the output of the driven circuit to supply a proper supply voltage to the driven circuit.

The gradient detecting unit differentiates the output of the driven circuit to detect the gradient therein. The differentiating circuit may be made up of a relatively simple circuit arrangement, including a resistor, capacitor and so on.

The voltage supply unit may comprise a comparator for comparing the offset voltage with the supply voltage and a chopper circuit controlled by the output of the comparator for outputting a supply voltage toward the driven circuit and comparator.

Thus, for example, the chopper circuit may operate to increase the supply voltage if the supply voltage, being the output of the chopper circuit, is smaller than the offset voltage, and to decrease the supply voltage if the supply voltage is larger than the offset voltage. Thus, the supply voltage can follow the offset voltage at all times.

The power supply circuit of the present invention also comprises:

a first attenuator disposed in an input path from the output of said driven circuit to said offset voltage generating unit, said first attenuator being operative to attenuate the output of said driven circuit; and a second attenuator disposed in an input path from the supply voltage to said comparator, said second attenuator being operative to attenuate the supply voltage inputted into the comparator.

The provision of such first and second attenuators causes the comparator to compare the attenuated signals with each other. If the first and second attenuators have the same attenuation factor, the supply voltage will follow the output signal of the driven circuit to which a given voltage is added. The relation between the output of the driven circuit and the supply voltage can be changed by employing first and second attenuators having different attenuator factors.

Even if an excessive voltage substantially equal to the original supply voltage in a circuit for driving the power supply circuit itself is outputted from the driven circuit or the voltage supply unit, it will not be inputted directly into the offset generating unit and/or comparator, but can be attenuated before it is inputted thereto. This can prevent these circuits from being made inoperative by the input of such an excessive signal.

The gradient detecting unit may comprise a differentiating circuit comprising a capacitor of capacitance C and a resistor of resistance R which are connected in series with each other; the differentiating circuit having $f=1/(2\pi RC)$, the value f being set to a suitable value, whereby in addition to detection of the gradient, a processing signal can be provided which has a variable phase depending on the frequency in the output signal of the driven circuit.

Thus, by suitably selecting the values of the capacitance C and resistance R (for example in order to make f=20 kHz), the processing signal will provide an ideal differentiated value if the output signal of the driven circuit is of low-frequency. For example, if the output signal is one kHz, the phase of the detected gradient signal will be out shifted prior to the output signal of the driven circuit by about 90 degrees, to generate a processing signal of very low level.

But if the output signal of the driven circuit is of high-frequency, for example, when it is equal to about 20 kHz, the phase of the detection signal representing the gradient in the output signal of the driven circuit will be shifted prior to the output signal of the driven circuit by about 45 degrees to generate a processing signal of very high level.

When the output signal of the driven circuit is of low-frequency, thus, the maximum processing signal can be obtained at a location adjacent to the ground in the output signal of the driven circuit which may provide an increased danger in that the supply voltage following the offset voltage is brought into contact with the output signal of the driven circuit. On the other hand, when the output signal of the driven circuit is of low-frequency, the change of voltage becomes relatively gentle. This decreases such a danger and only requires a processing signal reduced in maximum value.

In addition, when the output signal of the driven circuit is of high-frequency, the maximum processing signal can be provided at a location adjacent to the middle in the output signal of the driven circuit which may provide an increased danger in that the supply voltage following the offset voltage is brought into contact with the output signal of the driven circuit.

Since the offset voltage is generated based on the processing signal as described, the power supply to the driven circuit can be prevented from being insufficient through contact of the output signal of the driven circuit with the supply voltage, irrespective of the frequency in the output signal of the driven circuit.

By changing the phase and level of the detected gradient depending on the frequency in the output signal of the driven circuit and by supplying the supply voltage following the generated offset voltage to the driven circuit, the supply voltage can more efficiently be provided depending on the output signal of the driven circuit. Even if the output signal of the driven circuit abruptly varies, the driven circuit can receive the supply voltage following the output thereof with allowance.

The present invention also provides an amplifier in order to effect the supplying of a supply voltage from such a power supply circuit as described above to an amplifying circuit.

Thus, the supply voltage following the level of an amplified signal being the output of the amplifying circuit can be supplied to and amplified by the amplifying circuit more efficiently.

In one preferred embodiment, the power supply circuit, comprising a gradient detecting unit, an offset voltage generating unit and a voltage supply unit as described above, may be mounted in a (hybrid) integrated circuit system. Thus, the composite integrated circuit system can be modified into a system having a power supply circuit which is more efficiently actuated depending on the state of a driven circuit.

In another preferred embodiment, the power supply circuit, comprising a signal amplifying unit, a gradient detecting unit, an offset voltage generating unit and a voltage supply unit as described above, may be mounted in a composite integrated circuit system. Similarly, the composite integrated circuit system can be modified into a system having a power supply circuit which is more efficiently actuated depending on the state of the signal amplifying unit.

In the latter system, the area in which the signal amplifying circuit is disposed may be separated from the areas in which the gradient detecting unit, the offset voltage generating unit and the voltage supply unit are disposed. In such a case, the signal amplifying unit can be prevented to the utmost from being adversely affected by any noise which tends to be generated in the power supply circuit of the present invention (comprising the gradient detecting unit, offset voltage generating unit and voltage supply unit).

BRIEF DESCRIPTION OF THE INVENTION

DETAILED DESCRIPTION OF THE PREFERRED EMBODIMENTS

Some preferred embodiments of the present invention will now be described with reference to the drawings.

Overall Layout

Figure 8:
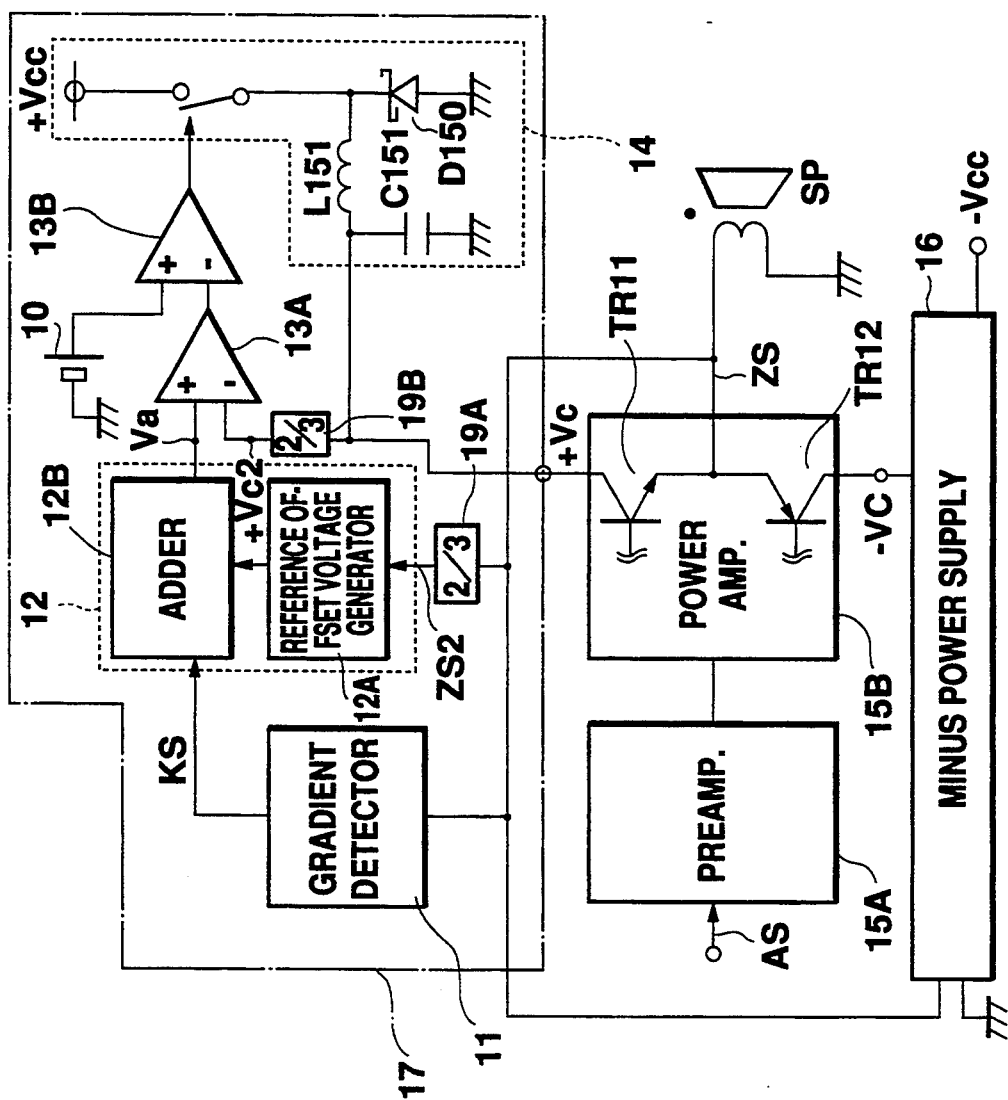
FIG. 8 is a block diagram showing the entire layout of one embodiment of the present invention.

Referring first to FIG. 8, there is shown a high efficiency audio amplifier constructed in accordance with one embodiment of the present invention, which comprises a positive power supply circuit 17, a negative power supply circuit 16, a preamplifier 15A and a power amplifier 15B. The preamplifier 15A receives and amplifies an audio input signal AS, the amplified input signal being then provided to the power amplifier 15B. The power amplifier 15B further amplifies the amplified input signal to form an amplified signal ZS which is in turn supplied to and outputted from a loudspeaker SP as an audio output signal. The power amplifier 15B comprises an NPN transistor TR11 and a PNP transistor TR12 which are connected in series with each other. When these transistors TR11 and TR12 receive the signal from the preamplifier 15A at their bases, the junction point between the transistors outputs the amplified signal ZS. The positive power supply circuit 17 is connected to the transistor TR11 of the power amplifier 15B on the upper side thereof while the negative power supply circuit 16 is connected to the transistor TR12 on the lower side thereof. The positive power supply circuit 17 outputs a positive supply voltage (+Vc) toward the power amplifier 15B while the negative power supply circuit 16 outputs a negative supply voltage (−Vc) toward the power amplifier 15B. For simplicity, this embodiment will be described only in connection with the positive power supply circuit 17 because the negative power supply circuit 16 is substantially similar to the positive power supply circuit 17 except that the former is driven by a negative power source (−Vcc) in a symmetrical manner relative to the positive power supply circuit 17. The positive power supply circuit 17 is driven by a positive power source (+Vcc).

The positive power supply circuit 17 comprises a constant voltage generating circuit 10, a gradient detecting unit 11, an offset voltage generating unit 12, a first comparator 13A, a second comparator 13B and a chopper power supply circuit 14. The amplified signal ZS, being the output of the power amplifier 15B, is applied to the gradient detecting unit 11 which in turn differentiates the amplified signal ZS to form a processing output signal KS relating to the gradient. The amplified signal ZS is also attenuated to $\frac{2}{3}$ of its original amplitude by a first attenuator 19A to form an attenuated and amplified signal ZS2 which is in turn supplied to the offset voltage generating unit 12. The offset voltage generating unit 12 comprises a reference offset voltage generating unit 12A and an addition circuit 12B. The reference offset voltage generating unit 12A adds a given voltage to the attenuated and amplified signal ZS2 to form a reference offset voltage which varies depending on the attenuated and amplified signal ZS2. The addition circuit 12B adds the processing signal KS from the gradient detecting unit 11 to the voltage from the reference offset voltage generating unit 12A to form an output signal Va which varies depending on the amplified signal ZS and becomes larger as the gradient in the amplified signal ZS increases. The first and second attenuators 19A and 19B may be omitted.

The output signal Va of the offset voltage generating unit 12 is applied to the comparator 13A at its noninverting input terminal. On the other hand, the inverting input terminal of the comparator 13A receives the supply voltage Vc being the output of the chopper circuit 14 through the second attenuator 19B. Furthermore, the output of the comparator 13A is supplied to the comparator 13B at its inverting input terminal, with the noninverting input terminal thereof receiving a constant voltage from the constant voltage generating circuit 10. The comparator 13B then compares the output voltage of the comparator 13A with the constant voltage to form a signal for controlling the chopper power supply circuit 14 in its switching operation. Therefore, the voltage Vc being the output of the chopper power supply circuit 14 varies depending not only on the amplitude of the amplified signal ZS but also the output KS of the gradient detecting unit 11. When the amplified signal ZS abruptly varies, the processing output signal KS, which represents the gradient of amplified signal ZS, is increased and then, the output signal Va of the offset voltage generating unit 12 is raised. As the supply voltage Vc varies following said Va, the power amplifier 15B will not be clipped and can operate appropriately due to this operation of the supply voltage thereto.

Figure 9:
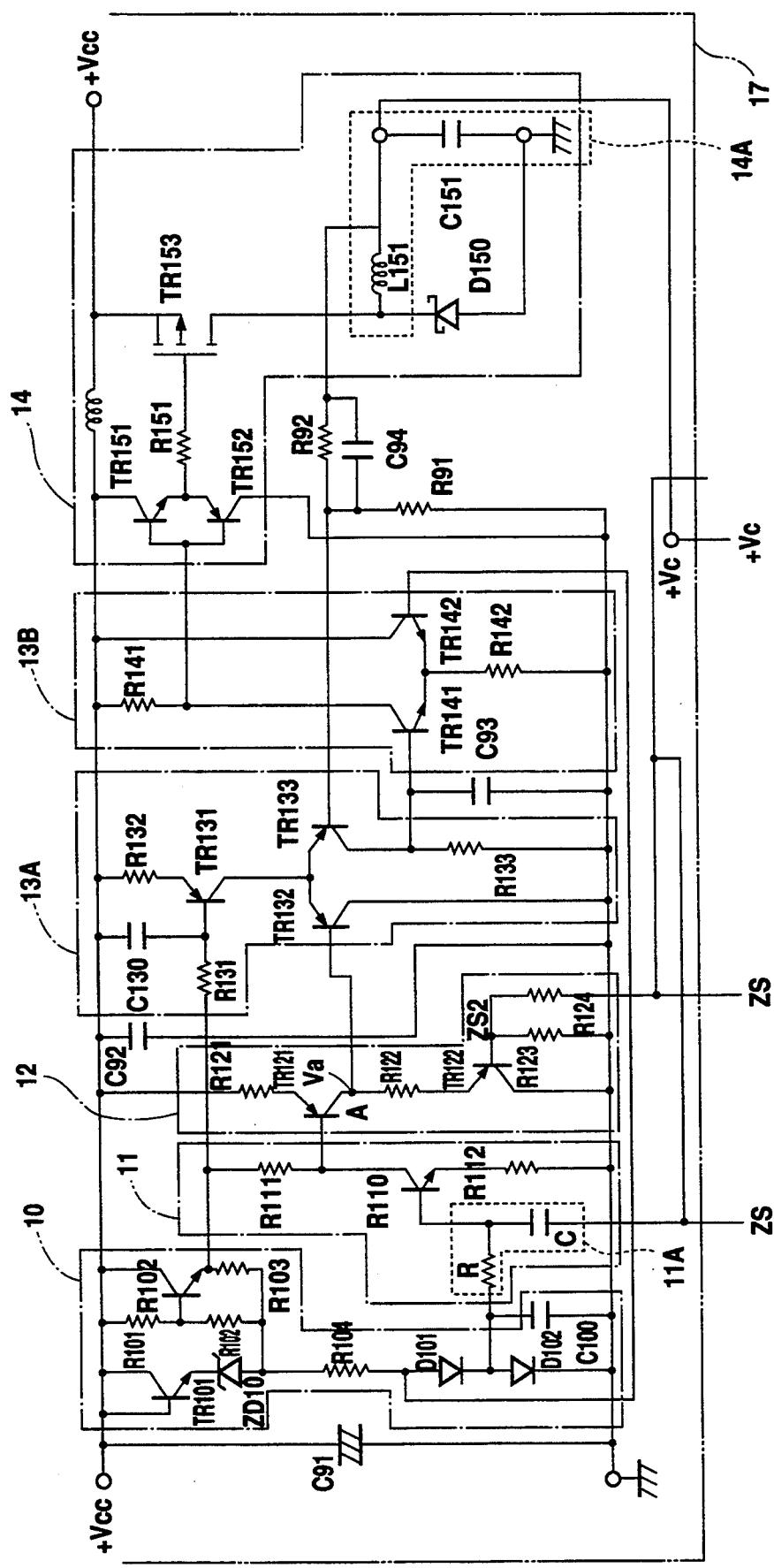
FIG. 9 is a circuit diagram of a power supply circuit of the circuit of FIG. 8.

FIG. 9 shows the details of the positive power supply circuit 17. The arrangement and function thereof will be described with reference to FIG. 9.

Constant Voltage Generating Circuit

The constant voltage generating circuit 10 is adapted to generate a constant voltage from the positive power source (+Vcc). The power source (+Vcc) is connected to the collector and base of an NPN transistor TR101. The emitter of the transistor TR101 is connected to the cathode of a Zener diode ZD10. Resistors R101 and R102 are connected between the power source (+Vcc) and the anode of the Zener diode ZD10. An NPN transistor TR102 and a resistor R103 are also connected in series between the power source (Vcc) and the anode of the Zener diode ZD10. The base of the transistor TR102 is connected to the junction point between the resistors R101 and R102. The combination of the transistor TR101 with the Zener diode ZD10 provides a predetermined constant voltage in the Zener diode ZD10 at the cathode side thereof. Thus, the current in the transistor TR102 will be reduced to output the predetermined constant voltage from the emitter of the same transistor TR102. In such a manner, the constant voltage generating circuit 10 generates the constant voltage through the combination of the transistor TR101 with the Zener diode ZD10. Consequently, this constant voltage will be better in temperature compensation and more stable in its characteristics.

The anode of the Zener diode ZD10 is connected to ground through a resistor R104 and diodes D101 and D102. The junction point between the resistor R104 and the diode D101 outputs a desired constant voltage. The diode D102 is also connected in parallel to a capacitor C100. The constant voltage generating circuit 10 also outputs a predetermined constant voltage from the junction point between the diodes D101 and D102.

Gradient Generating Circuit 11

The gradient detecting unit 11 comprises a differentiating circuit 11A including a capacitor C and a resistor R, a transistor TR110 and resistors R111 and R112. Namely, the amplified signal ZS is coupled with the base of the transistor TR110 through the capacitor C. The voltage at the junction point between the diodes D101 and D102 in the constant voltage generating circuit 10 is coupled with the base of the transistor TR110 through the resistor R. The collector of the NPN-type transistor TR110 is connected to the emitter of the transistor TR102 in the constant voltage generating circuit 10 through a resistor R111. The emitter of the transistor TR110 is connected to ground through a resistor R112. The collector of the transistor TR110 outputs the processing signal KS for gradient. More particularly, the base potential in the transistor TR110 varies depending on the output of the differentiating circuit 11A. Correspondingly, the collector current varies to output a gradient-dependent voltage signal (processing signal) at the junction point between the resistor R111 and the collector of the transistor TR110.

In this embodiment, the processing signal KS detected at the differentiating circuit 11A and representing the gradient has its phase varying depending on the frequency of the amplified signal ZS.

More particularly, the resistance R of the resistor R and the capacitance C of the capacitor C in the differentiating circuit 11A are set to fulfill a condition such that a value f represented by the following equation:

$$f = 1/2\pi RC$$

is within a range from 0.5 times to 2 times higher than the maximum frequency (20 kHz) of the amplified signal ZS being the audio signal (that is, between 10 kHz and 40 kHz). In this embodiment, the resistance R and capacitance C are set to provide f=20 kHz.

The reason for this will be described with reference to FIGS. 10 and 11.

Figure 10:
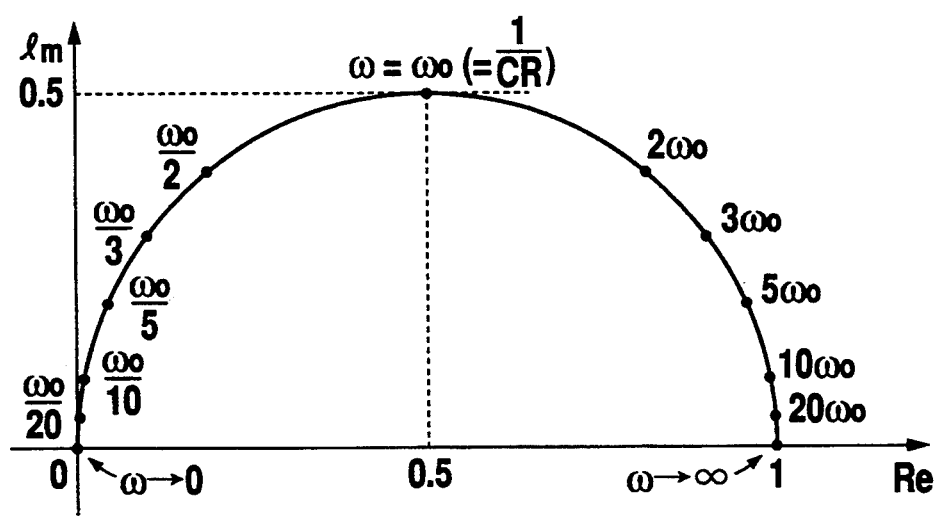
FIG. 10 is a graph for explaining the operation of the gradient detecting unit.
Figure 11:
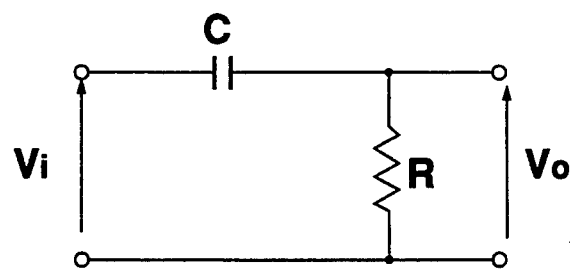
FIG. 11 is an equivalent circuit diagram of the gradient detecting unit.

FIG. 10 shows a locus of changes in the phase and amplitude of an output signal corresponding to the angular frequency ($\omega$) of the input signal in such a conventional differentiating circuit as shown in FIG. 11. In FIG. 10, the abscissa axis is a real axis while the ordinate axis is an imaginary axis.

If the angular frequency ($\omega$) of the input signal (vi) is sufficiently small relative to $\omega 0 = (1/RC)$ or if the values R and C in the differentiating circuit are set to fulfill such a condition that the value $f = 1/(2\pi RC)$ is sufficiently large relative to the maximum frequency $f_{max}$ of the input signal (vi) and more particularly within a range between about 5 times and about 7 times higher than the maximum frequency $f_{max}$ of the input signal (vi), the amplitude of the output signal (vO) or the distance from the origin in FIG. 10 is proportional to the angular frequency ($\omega$). The deviation in phase or the angle relative to the real axis becomes equal to about 90 degrees. This substantially provides an ideal differentiation. In such a case, the phase of the output signal (vO) relative to the input signal (vi) will not substantially have any frequency characteristic. Therefore, the waveform of the output signal (vO) will always be out from that of the input signal (vi) by 90 degrees, independent of the frequency of the input signal (vi).

If the angular frequency ($\omega$) of the input signal is near the value $\omega 0 = (1/RC)$ or if the values R and C of the differentiating circuit are set to fulfill such a condition that the value $f = 1/(2\pi RC)$ sufficiently approaches the maximum frequency ($f_{max}$) of the input signal (vi) and more particularly is within a range between about 0.5 times and about 2 times higher than the maximum frequency ($f_{max}$) of the input signal (vi), the proportional relationship between the amplitude of the output signal (vO) and the frequency is broken. Thus, the phase becomes smaller than 90° and a frequency-dependency occurs. As the angular frequency ($\omega$) of the input signal (vi) is just coincident with the value ($\omega 0$), the deviation in phase becomes 45 degrees as shown in FIG. 10.

Since the differentiating circuit 11A of the gradient detecting unit 11 in this embodiment is set to fulfill such a condition that the value $f = 1/(2\pi RC)$ is coincident with the maximum frequency 20 kHz of the audio signal, the deviation in phase between the processing output signal KS and the amplified input signal ZS becomes approximately +90° if the frequency of the amplified signal ZS is equal to one kHz and approximately +60° if it is equal to 10 kHz and approximately +45° if it is equal to 20 kHz.

Thus, the deviation in phase between the processing signal (KS) and the amplified signal (ZS) varies depending on the frequency of the amplified signal ZS. The processing signal KS can be generated flexibly depending on the state of the amplified signal ZS. By thereafter generating an offset voltage Va and then a supply voltage (+Vc) following the offset voltage, the system can flexibly accommodate itself to the changed state of the amplified signal ZS. The details thereof will be described with reference to FIGS. 12 and 13.

Offset Voltage Generating Unit 12

The offset voltage generating unit 12 comprises transistors TR121 and TR122 and resistors R121 to R124. The collector of the transistor TR110, which is the output of the gradient detecting unit 11, is connected to the base of the PNP-type transistor TR121. The emitter of the transistor TR121 is connected to a supply voltage (+Vcc) through the resistor R121. On the other hand, the collector of the transistor TR121 is connected to the emitter of the PNP-type transistor TR122 through the resistor R122. The collector of the transistor TR122 is connected to ground. The base of the transistor TR122 is connected to ground through the resistor R123 and is adapted to receive the amplified signal ZS through the resistor R124.

The values of the resistances in the resistors R123 and R124 are set to be in a 2:1 ratio. The amplified signal ZS is inputted into the base of the transistor TR122 after it has been attenuated to ⅔ of its original amplitude. Therefore, the current in the transistor TR122 will vary depending on the attenuated and amplified signal ZS2 whose amplitude is ⅔ of the amplitude of the amplified signal ZS. On the other hand, the base of the transistor TR121 receives the output signal (processing signal KS) of the gradient detecting unit 11. Thus, the current in the transistor TR121 will vary depending on the gradient in the amplified signal ZS. As the current in the transistors TR121 and TR122 increases, the current passing through the resistor R123 also increases. Therefore, the potential in the collector of the transistor TR121 will vary depending on its current. In other words, a voltage formed by superimposing a given voltage on the attenuated and amplified signal ZS2 plus a voltage added by the changed base potential of the transistor TR121 accompanied by the changed collector current of the transistor TR110 appears on the collector of the transistor TR121. Such a voltage is called "offset voltage Va". The offset voltage Va is outputted from the offset voltage generating unit 12.

Comparators 13A and 13B

The first and second comparators 13A and 13B define one embodiment of a drive/control unit for controlling the chopper power supply circuit 14.

The first comparator 13A comprises transistors TR131–TR133, resistors R131–R133 and a capacitor C130. The transistors TR132 and TR133 are of PNP-type and have their emitters connected together. The base of the transistor TR132 receives the output voltage Va from the offset voltage generating unit 12. On the other hand, the base of the transistor TR133 receives a voltage resulting from attenuation of the output voltage of the chopper power supply circuit 14 through an attenuator. The emitters of the transistors TR132 and TR133 are connected to the power source Vcc through the PNP-type transistor TR131 and the resistor R132. The base of the transistor TR131 is connected to the emitter of the transistor TR102 in the constant voltage generating circuit 10 through the resistor R131 and is also connected to the power source (+Vcc) through the capacitor C130. Thus, the transistor TR131 receives the constant voltage from the constant voltage generating circuit 10 and then outputs a constant current. As a result, the total current in the transistors TR132 and TR133 is constant at all times. The collector of the transistor TR132 is connected to ground while the collector of the transistor TR133 is connected to ground through the resistor R133. The comparator 13A thus causes the collector of the transistor TR133 to output a voltage signal corresponding to a differential voltage between the bases of the transistors TR132 and TR133.

More particularly, the comparator 13A compares the attenuated supply voltage (+Vc2) obtained by attenuating the voltage (+Vc) supplied from the chopper power supply circuit 14 to the base of the transistor TR133 with the offset voltage Va. If the attenuated supply voltage (+Vc2) is higher than the offset voltage Va, a low current flows from the transistor TR131 to the transistor TR132. On the contrary, if the attenuated supply voltage Vc2 is lower than the offset voltage Va, almost all of the constant current flows to the transistor TR133. Thus, the transistor TR133 will output a voltage signal corresponding to the current therein.

The second comparator 13B comprises transistors TR141 and TR142 and resistors R141 and R142.

The emitters of the NPN-type transistors TR141 and TR142 are connected together and also to ground through the resistor R142. On the other hand, the collector of the transistor TR141 is connected to the power source (+Vcc) through the resistor R141, while the collector of the transistor TR142 is connected directly to the power source (+Vcc). The base of the transistor TR141 is connected to the collector of the transistor TR133 which is the output of the first comparator 13A. The base of the transistor TR142 is connected to the anode of a diode D101 which provides a constant output voltage in the constant voltage generating circuit 10. A capacitor C93 disposed between the base of the transistor TR141 and the ground functions to delay variations in the base voltage of the transistor TR141 in order to suppress oscillation of the circuit.

The second comparator 13B compares the output to the first comparator 13A with a given constant voltage to cause the collector of the transistor TR141 to output a voltage signal corresponding to the current of the transistor TR141.

Chopper Power Supply Circuit 14

The chopper power supply circuit 14 comprises transistors TR151 and TR152, a MOS-type transistor TR153, a resistor R151, a capacitor C151, a diode D150 and a coil L151. The capacitor C151 and coil L151 define a low-pass filter 14A. The collector of the NPN-type transistor TR151 is connected to the power source (+Vcc) while the emitter thereof is connected to the emitter of the PNP-type transistor TR152. The collector of the transistor TR152 is connected to the ground. The bases of the transistors TR151 and TR152 are connected to each other and also to the collector of the transistor TR141, which is the output of the comparator 13B. If the output of the comparator 13B is at a low level, the transistor TR152 is turned on. The junction point between the emitters of the transistors TR151 and TR152 is connected to the gate of the MOS-type transistor TR153 through the resistor R151. The MOS-type transistor TR153 is of the P-channel type. The source of the MOS transistor TR153 is connected to the power source (+Vcc) while the drain thereof is connected to the low-pass filter 14A. Namely, the coil L151 and capacitor C151 in the low-pass filter 14A are connected in series with each other. The capacitor C151 is connected to ground at one end. A diode D150 is disposed between one end of the coil L151 and ground to maintain a current path for continuing current in the coil L151 when MOS transistor TR153 is off. If the MOS-type transistor TR153 becomes low, the transistor TR153 is turned on to supply a current to the low-pass filter 14A and to accumulate charge in the capacitor C151. Thus, the voltage at the junction point between the coil L151 and the capacitor C151 will be controlled by switching the transistor TR151 on and off. The voltage at the junction point is outputted as the voltage (+Vc). The voltage (+Vc) is coupled with the base of the transistor TR133 in the first comparator 13A through a resistor R92. The base of the transistor TR133 is connected to ground through a resistor R91. The output voltage (supply voltage (+Vc) of the chopper power supply circuit 14) will be divided by the resistors R91 and R92 before being supplied to the base of the transistor TR133. In this embodiment, the ratio of resistance values in the two resistors R91 and R92 is set to be 2:1. Therefore, the supply voltage (+Vc) will be supplied to the base of the transistor TR133 as a supply voltage (+Vc2) whose amplitude is ⅔ of the amplitude of the supply voltage (+Vc). The capacitor C94 is connected in parallel to the resistor R92 to input ripple components of the voltage (+Vc) into the base of the transistor TR133 without attenuation. This allows the oscillation of the circuit to become stable.

The operation of the power supply circuit will be described below. It is now assumed that the positive supply voltage (+Vcc) for driving the power supply circuit has been applied to the constant voltage generating circuit 10, the gradient detecting unit 11, the offset voltage generating unit 12, the first comparator 13A, the second comparator 13B and the chopper power supply circuit 14.

An audio signal AS is first inputted into the preamplifier 15A and then is amplified by the power amplifier 15B. The amplified signal ZS is outputted toward the loudspeaker SP through the final stage transistors TR11 and TR12.

The amplified signal ZS is also inputted into the differentiating circuit 11A of the gradient detecting unit 11 and into the base of the transistor TR122 in the offset voltage generating unit 12 through the resistor R124.

If the amplified signal ZS is not inputted into the base of the transistor TR110 in the gradient detecting unit 11, the constant voltage is instead applied thereto from the constant voltage generating circuit 10. Because the emitter potential thereof is zero, however, no collector current will now flow through the transistor TR110.

As the amplified signal ZS is inputted into the base of the transistor TR110, the waveform of an output signal therefrom is differentiated by the differentiating circuit 11A into a phase corresponding to the frequency of the amplified signal ZS to form a processing signal KS. The processing signal KS varies the base potential of the transistor TR110 to change the collector current thereof.

If the base potential of the transistor TR110 is lower than the anode potential of the diode D102, the transistor TR110 will be blocked. The waveform of the collector current of the transistor TR110 will be one obtained by clipping the output of the differentiating circuit 11A.

If the rise gradient of the amplified signal ZS is sharp, the output of the differentiating circuit 11A is greatly shifted to the positive side. Thus, the collector current of the transistor TR110 possesses a correspondingly increased value.

On the other hand, if the amplified signal ZS has its fall gradient, the output of the differentiating circuit 11A is shifted to the negative side. However, the collector current will not flow in the transistor TR110 due to clipping therein.

If the collector current flows in the transistor TR110, the base potential of the transistor TR121, which has caused a constant dc current to flow through the collector by the constant voltage generating circuit 10 maintaining the base potential constant, is lowered by the changed collector current of the transistor TR110. The collector current of the transistor TR121 is increased by an amount corresponding to this lowered base potential. As a result, the collector current is increased at the point A.

On the other hand, the amplified signal ZS is simultaneously attenuated by the first attenuator 19A to form an attenuated and amplified signal ZS2 which is only ⅔ of the amplitude of the amplified signal ZS. The attenuated and amplified signal ZS2 is then inputted into the base of the transistor TR122 in the offset voltage generating unit 12.

Although the transistor TR122 responds to the attenuated and amplified signal ZS2 for carrying out an emitter follower operation, a waveform obtained by clipping the attenuated and amplified signal ZS2 only on the negative side thereof appears at the base and emitter of the transistor TR122. This waveform appears because the emitter is saturated when the attenuated and amplified signal ZS2 is shifted to the negative side.

The current formed by the transistor TR121 flows to the emitter of the transistor TR122 through the resistor R122. The emitter potential of the transistor TR122 will not depend on such a current, but the resistor R122 responds to this current to form a differential potential. Therefore, the potential at the point A will be equal to the emitter potential of the transistor TR122 plus the differential potential of the resistor R122.

Since the collector current of the transistor TR121 is inherently determined by the output voltage of the constant voltage generating circuit 10, the waveform at the point A will be one formed by shifting a clipped waveform appearing at the emitter of the transistor TR122 toward the constant voltage.

If the amplified signal ZS has a sharp rise gradient, however, the gradient detecting unit 11 functions to increase the collector voltage of the transistor TR121. As a result, the potential at the point A, or the offset voltage Va, will have a waveform which is formed by adding:

1) the clipped waveform of the attenuated and amplified signal ZS2;
2) the constant dc voltage; and
3) the clipped waveform outputted from the differentiating circuit 11A. The resulting offset voltage Va is applied to the base of the transistor TR132 which is the noninverting input of the first comparator 13A.

The base of the transistor TR133, which is the inverting input of the first comparator 13A, receives the output voltage of the chopper power supply circuit 14 attenuated to ⅔ of its original amplitude by the second attenuator 19B. That is, it receives an attenuated supply voltage (+Vc2).

Thus, the first comparator 13A compares the offset voltage Va with the attenuated supply voltage (+Vc2) and:

(i) If the offset voltage Va is larger than the attenuated supply voltage (+Vc2), the transistors TR132 and TR133 are respectively turned off and on since the base potential of the transistor TR132 is higher than that of the transistor TR133.

The base potential of the transistor TR141 is then increased by the collector current of the transistor TR133. As a result, the transistors TR141 and TR142 are turned on and off, respectively.

When the transistor TR141 is turned on to pass the collector current therethrough, the base potential of transistors TR151 and TR152, which define a driver for the chopper power supply circuit 14, is reduced to output a low-level voltage toward the gate of a MOS-type transistor TR153.

The MOS-type transistor TR153 is of the p-channel type. Therefore, the transistor TR153 is turned on by the low level signal to increase the attenuated supply voltage (+Vc2), thus following the offset voltage Va. The attenuated supply voltage continues to increase beyond the offset voltage Va.

(ii) If the offset voltage Va is smaller than the attenuated supply voltage (+Vc2), the transistors TR132 and TR133 are respectively turned on and off since the base potential of the transistor TR132 is lower than that of the transistor TR133.

As a result, the collector current of the transistor TR133 will not flow therethrough. Thus, the base potential of the transistor TR141 is reduced to turn the transistors TR141 and TR142 off and on, respectively.

When the transistor TR141 is turned off with the collector current being blocked, the base current in the transistors TR151 and TR152, which define the driver for the chopper power supply circuit 14, is increased to output a high-level voltage toward the gate of the MOS-type transistor TR153.

As the high-level voltage is applied to the gate of the MOS-type transistor TR153, it is turned off. As a result, the supply voltage (+Vc), which is the output of the low-pass filter 14A, begins to lower.

In such a case, the supply voltage (+Vc) lowers to the ground potential with passage of time. Since the first comparator 13A compares the attenuated supply voltage (+Vc2) with the offset voltage Va at all times, the system restores to the above state (i) if the attenuated supply voltage (+Vc2) becomes lower than the offset voltage Va. Therefore, the MOS-type transistor TR153 is again turned on and the attenuated supply voltage (+Vc2) and the supply voltage (+Vc) begin to increase.

In such a manner, the circuit repeats the aforementioned states (i) and (ii) to control the supply voltage (+Vc) such that the attenuated supply voltage (+Vc2) follows the offset voltage Va.

According to the amplifying circuit of this embodiment, the gradient detecting unit 11 differentiates the amplified signal ZS, which is the output of the power amplifier 15B, to form the attenuated and amplified signal ZS2. The offset voltage generating unit 12 then adds a given voltage to the attenuated and amplified signal ZS2. The adder circuit forms an offset voltage Va which is the sum of the differentiation of the amplified signal ZS and the attenuated and amplified signal ZS2 added by a given voltage.

Subsequently, the first comparator 13A compares the attenuated supply voltage (+Vc2), which is the output of the second attenuator 19B, with the offset voltage Va. Based on the result of this comparison, the second comparator 13A and chopper power supply circuit 14 act such that the attenuated supply voltage (+Vc2) will be caused to follow the offset voltage Va.

As described, the circuit can act such that the attenuated supply voltage (+Vc2) obtained by attenuating the supply voltage (+Vc) to ⅔ of its original amplitude is always caused to follow the sum of a voltage obtained by adding a given voltage to the attenuated and amplified signal ZS2, or the amplified signal ZS attenuated to ⅔ of its original amplitude and the differentiation of the amplified signal ZS.

Therefore, because the ratio of attenuation in the respective signals is equal to ⅔, the circuit can function to cause the supply voltage (+Vc) to follow a voltage obtained by adding a given voltage to the amplified signal ZS. As a result, the power amplifier 15B can be efficiently supplied with the supply voltage (+Vc) corresponding to the amplified signal ZS.

According to this embodiment, even if the system outputs an excessive amplified signal ZS substantially equal to the positive power source (+Vcc), only a voltage at most equal to ⅔ of the positive supply voltage (+Vcc) will be applied to the base of the transistor TR122, which is the input of the offset voltage generating unit 12. This result occurs because both the supply voltage (+Vc) and the amplified signal ZS are attenuated to ⅔ of their original amplitudes to form the attenuated supply voltage (+Vc2) and the attenuated and amplified signal ZS2.

This can prevent, to the utmost, the potential Va at the point A, which is added by the differential potential across the resistor R122 resulting from the constant current of the transistor TR121, from exceeding the positive power source (+Vcc).

For example, if the positive power source (+Vcc) is ±50 V and the constant voltage of the constant voltage generating circuit 10 is 3 V, an amplified signal ZS of ±50 V may be attenuated to ⅔ by the first attenuator 19A to form an attenuated and amplified signal ZS2 equal to about ±34 V, which is in turn inputted into the offset voltage generating unit 12. Therefore, the potential Va at the point A will not exceed the positive power source (+Vcc) even if the differential voltage across the resistor R122 is added to the attenuated and amplified signal ZS2.

This can reliably suppress the constant current from not being supplied from the transistors TR121 and TR131 to the offset voltage generating unit 12 and first comparator 13A, which would otherwise occur when the potential Va at the point A has exceeded the positive power source (+Vcc) and would make them become inoperative. Even if the amplified signal ZS is substantially equal to the positive power source (+Vcc), the supply voltage (+Vc) may be generated and supplied to follow the amplified signal ZS. Therefore, the dynamic range in the circuit can be enlarged unlike in the prior art.

Further, the circuit always functions to cause the supply voltage (+Vc) applied to the collector of the final stage transistor TR11 in the power amplifier 15B to follow the offset voltage Va, which is the sum of the voltage obtained by adding a given voltage to the amplified signal ZS and the differentiation of the processing signal KS.

Figure 12:
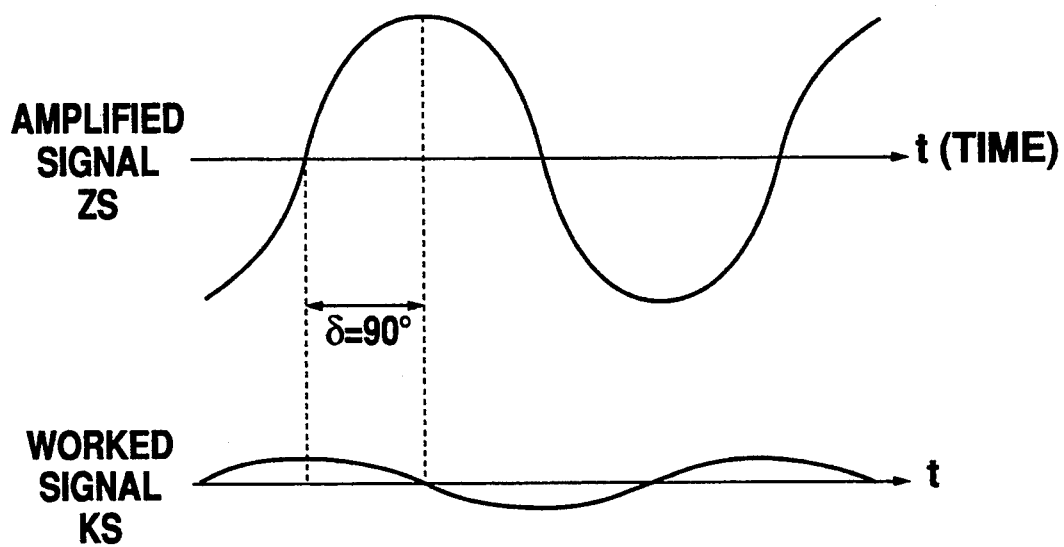
FIG. 12 is a graph showing the operation of the embodiment of the present invention.
Figure 12:
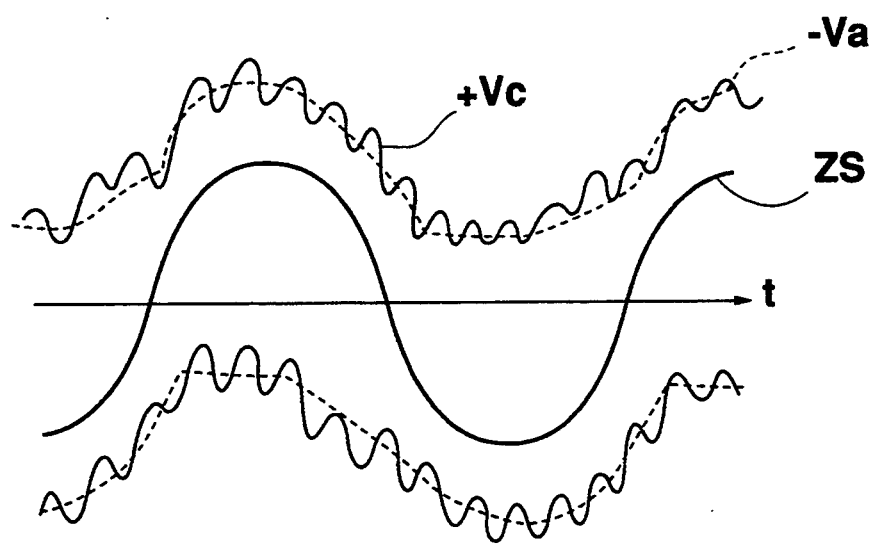

For example, if the amplified signal ZS is of a low frequency equal to about one kHz, the deviation of phase (δ) between the processing signal KS, generated by the gradient detecting unit 11, and the original amplified signal ZS becomes equal to 90 degrees to provide an ideal differentiation waveform, as shown in FIG. 12.

If the amplified signal ZS sharply varies or if the gradient thereof is maximum, the processing signal KS also is maximum. The offset voltage generating unit 12 adds the processing signal KS to the amplified signal ZS added by a given voltage to generate an offset voltage Va.

As shown by the lowermost graph in FIG. 12, a supply voltage (+Vc) is generated to follow the resulting offset voltage Va. The waveform of the supply voltage (+Vc) is brought into contact with that of the amplified signal ZS at a point adjacent to where the gradient in the amplified signal ZS becomes maximum to clip the output of the amplifier. This can suppress distortion in the amplified signal ZS.

Figure 13:
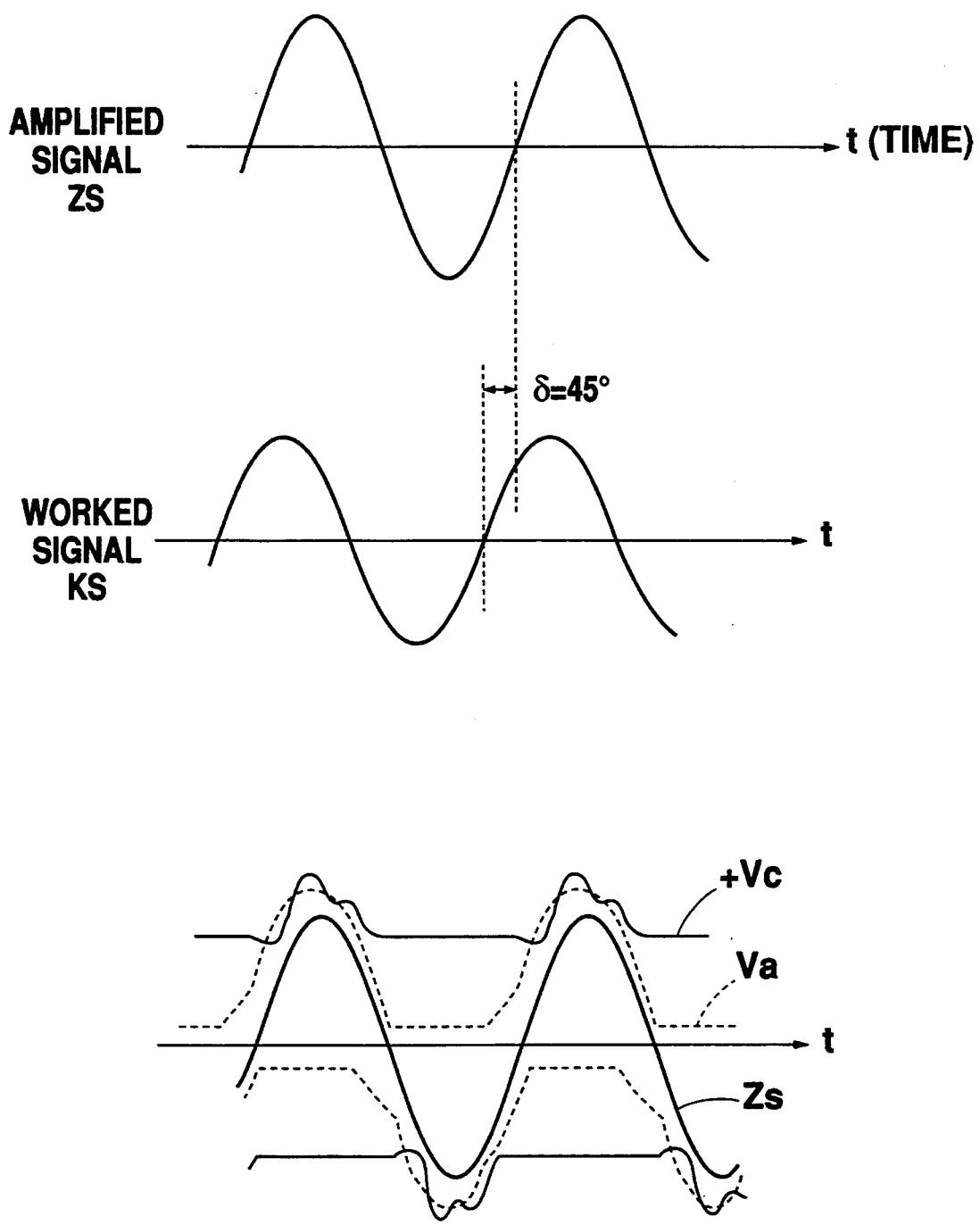
FIG. 13 is a graph showing the operation of the embodiment of the present invention.

For example, if the amplified signal ZS is of a high frequency equal to about 20 kHz, the deviation of phase (δ) between the processing signal KS, generated by the gradient detecting unit 11, and the original amplified signal ZS becomes equal to 45 degrees, as shown in FIG. 13. This cannot provide an ideal differentiation waveform.

In such a case, therefore, the processing signal KS becomes maximum adjacent to a point in which the amplified signal ZS becomes maximum. The offset voltage generating unit 12 adds the processing signal KS to the amplified signal ZS added by a given voltage to generate an offset voltage Va.

As shown by the lowermost graph in FIG. 13, the supply voltage (+Vc) will be generated to cause the offset voltage Va and the remaining voltage, which is a dc component formed by always holding charges in the capacitor C151 of the chopper power supply circuit 14, to follow the sum of the voltage. The waveform of the supply voltage (+Vc) is brought into contact with that of the amplified signal ZS at a point adjacent to the maximum value of the amplified signal ZS to clip the output of the amplifier. This can prevent the amplified signal ZS from being distorted.

Since the deviation of phase (δ) between the processing signal KS and the amplified signal ZS can be varied depending on the frequency of the amplified signal ZS, the amplified signal ZS can be avoided from being brought into contact with the supply voltage (+Vc) at a point adjacent to the maximum value of the amplified signal ZS in consideration of the effect of the remaining voltage, particularly when the amplified signal ZS is of high-frequency. Thus, the circuit can flexibly accommodate itself to the changed frequency of the amplified signal ZS.

The supply voltage (+Vc) can follow any change in the amplified signal ZS in sufficient time. The circuit can flexibly accommodate itself to the changed frequency of the amplified signal ZS and suppress the clipping of the amplifier output which would not be avoided in the prior art. Thus, the audio amplifier can be operated with an improved efficiency.

Figure 1:
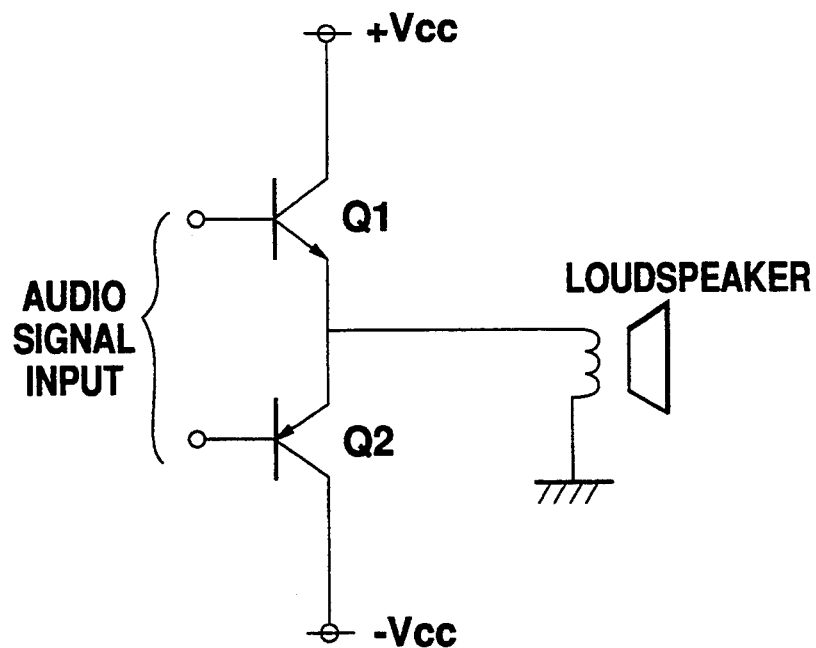
FIG. 1 is a view showing the layout of an amplifier constructed according to the prior art.
Figure 2:
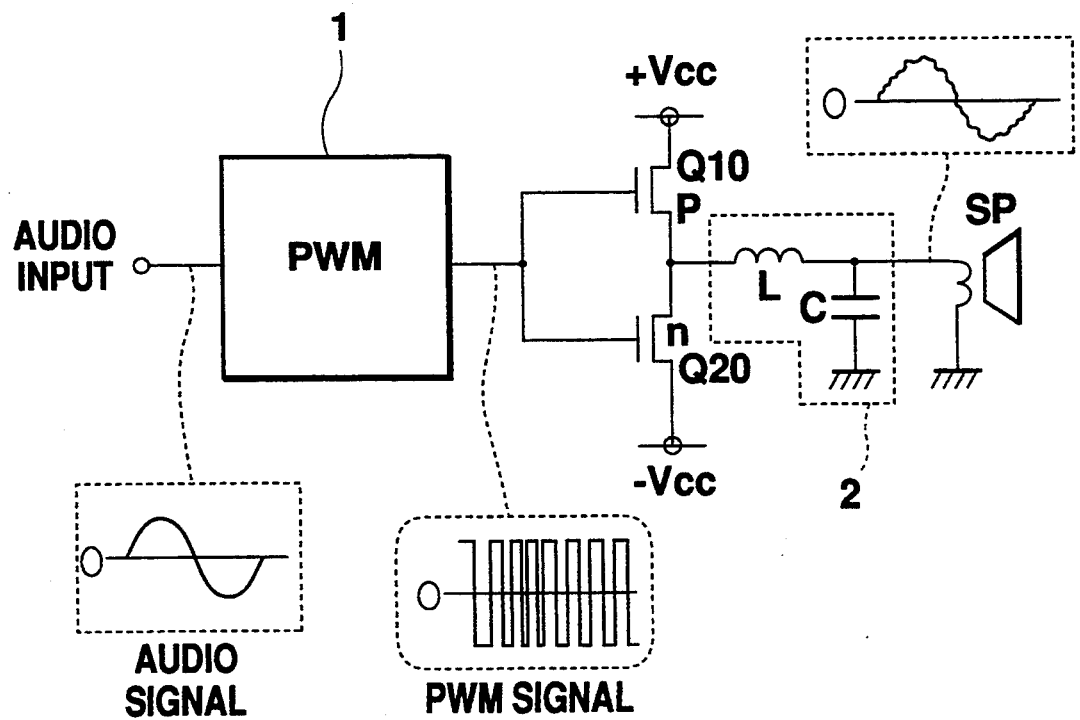
FIG. 2 is a view showing the layout of an amplifier which utilizes the prior art PWM.
Figure 3:
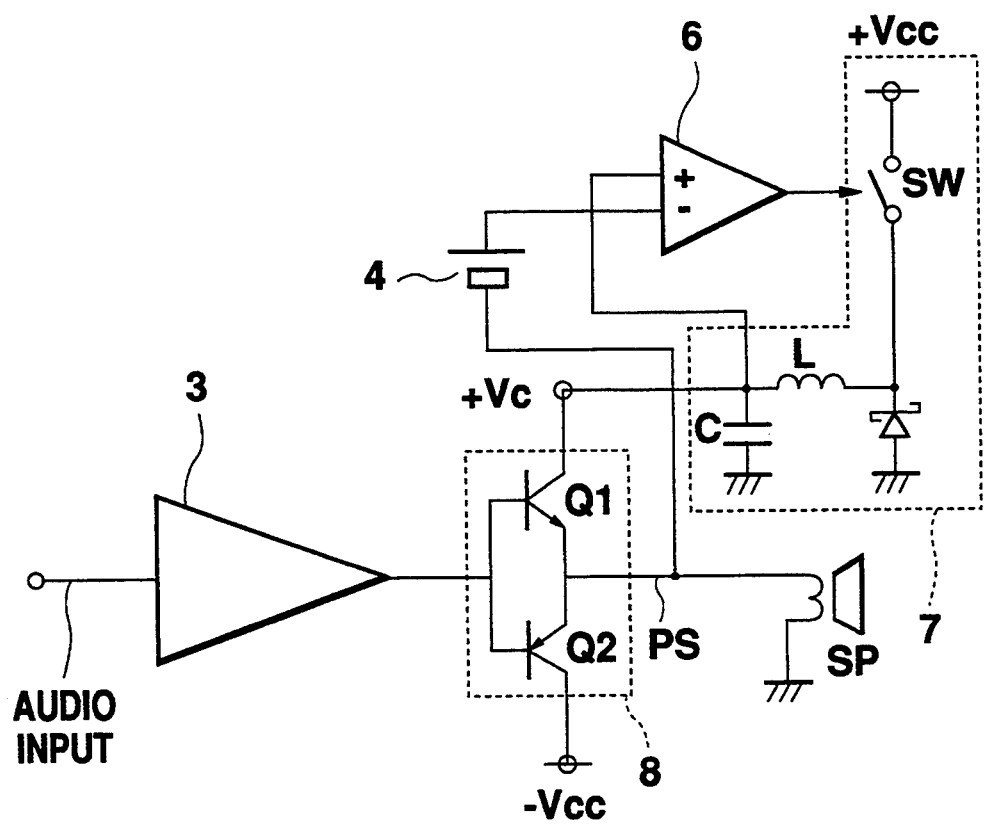
FIG. 3 is a view showing the layout of an amplifier and its power supply circuit.
Figure 4:
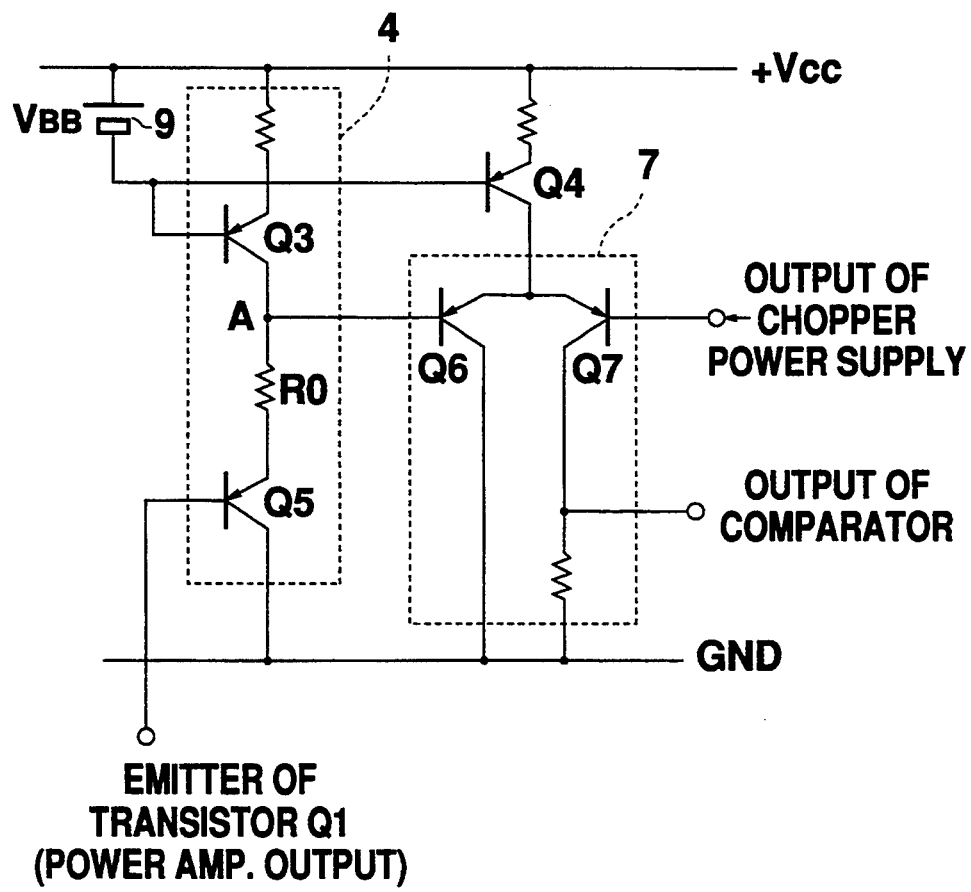
FIG. 4 is a view showing part of a power supply circuit according to the prior art.
Figure 5:
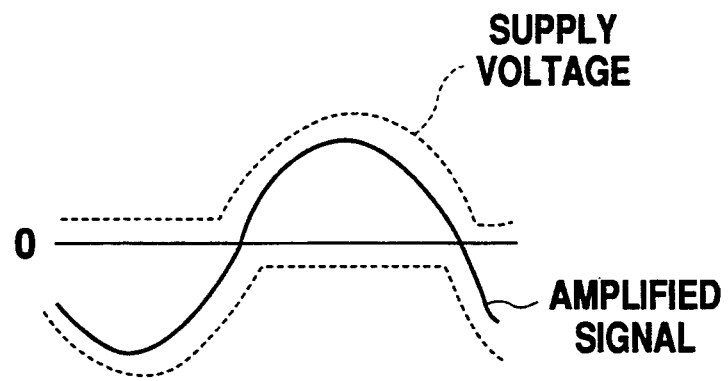
FIG. 5 is a graph showing the ideal changes in the output voltage (supply voltage) in the power supply circuit of the prior art.
Figure 6:
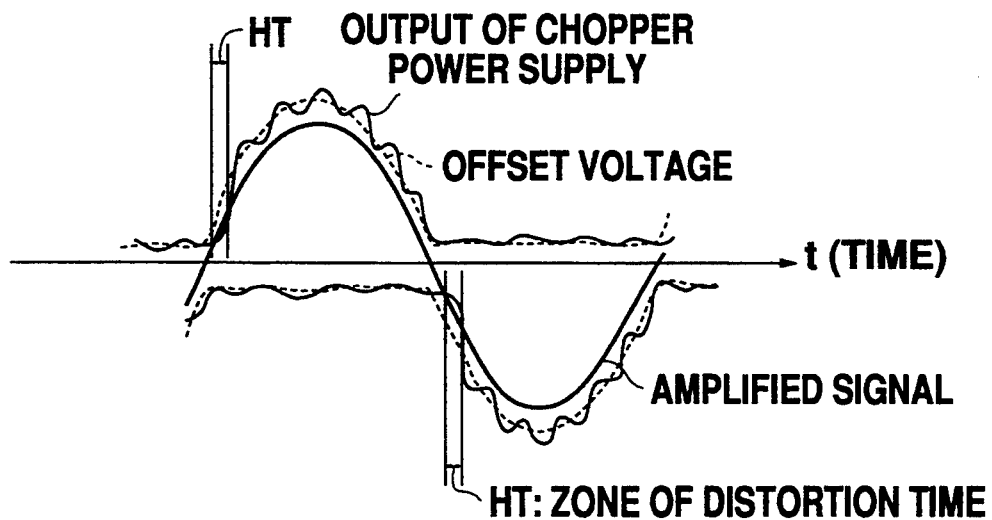
FIG. 6 is a graph showing problems in the output voltage (supply voltage) in the power supply circuit of the prior art.
Figure 7:
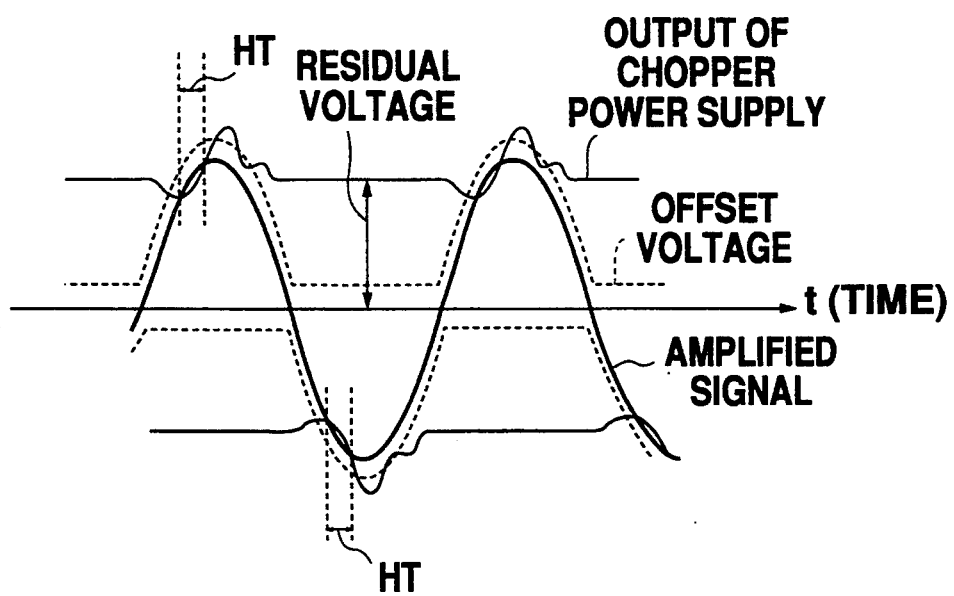
FIG. 7 is a graph showing problems in the output voltage (supply voltage) in the power supply circuit of the prior art.

Since the circuit of this embodiment does not use such a circuit as shown in FIG. 2, the audio amplifier of the present invention can more efficiently be operated while suppressing an adverse effect on the peripheral instruments such as wave disturbance. Such an adverse effect would be produced in the prior art because when a PWM signal is demodulated into an audio signal, its carrier components cannot be fully removed.

For the same purpose as that of the amplifying circuit according to this embodiment, a circuit has been proposed which, when a chopper power supply circuit is driven to follow an amplified signal to add a given offset voltage to a supply voltage and if the power supply cannot follow a sharp change in the amplified signal, an auxiliary power source path other than the chopper power supply is used to drive the chopper power supply circuit to cause the power supply to follow the sharp change in the amplified signal (see Japanese Patent Laid-Open No. Hei 4-372212).

Where amplified signals of larger amplitude are frequently outputted, such a circuit must frequently actuate the auxiliary power supply path. This will reduce the efficiency in such a circuit.

However, the amplifying circuit of this embodiment can use only the high-frequency chopper power supply circuit 14 to cause the power supply to follow the sharp change in the amplified signal. Even if amplified signals of larger amplitude and high frequency are frequently outputted, the efficiency of the system cannot be reduced.

Although this embodiment has been described as to the setting that the value $f=1/(2\pi RC)$ becomes equal to the maximum frequency of the audio signal (20 kHz), the present invention is not limited to such a setting. This embodiment may be similarly applied to such a setting that the above value f is within a range between 0.5 times and 2 times higher than the maximum frequency of the audio signal, that is, between 10 kHz and 40 kHz.

In addition, the power supply and amplifying circuits relating to this embodiment have other secondary advantages:

As shown in FIG. 9, this embodiment is formed such that the output of the chopper power supply circuit 14 is connected to the base of the transistor TR133, which is one input of the first comparator 13A, and that the circuit has a feedback path of: the chopper power supply circuit 14→ the first comparator 13A→ the second comparator 13B→ the chopper power supply circuit 14.

The capacitor C93 functioning as a delay means DE is further connected between the first and second comparators 13A and 13B. If the capacitor C93 is not provided, the oscillation frequency of the chopper power supply circuit 14 is equal to about 400 kHz. On the contrary, the provision of the capacitor C93 can reduce such an oscillation frequency to about 200 kHz. This improves the stability in oscillation to stabilize the power supply and thus the operation of the amplifying circuit.

Although this embodiment has been described as to the capacitor C93 as a delay means DE, the present invention is not limited to such a capacitor, but may be similarly applied to a feedback system including a coil or the like.

Since such an amplifying circuit as is used in the audio amplifier is highly affected by changes in its characteristics due to heat, it is desirable to improve the temperature characteristics. However, the circuit of this embodiment has very little change in its temperature characteristics. This will be described below.

When the transistor TR101 in the constant voltage generating circuit 10 is combined with the Zener diode ZD10, the generated constant voltage is improved in temperature compensation to stabilize its characteristics.

Any change of voltage between the base and emitter of the transistor TR102 in the constant voltage generating circuit 10 due to temperature can be offset by the change of voltage between the base and emitter of the transistor TR131, the base of which is connected to the emitter of the transistor TR102 through the resistor R131.

Since the change of voltage between the base and emitter of the transistor TR110 in the gradient detecting unit 11 due to temperature is offset by the change of voltage between the anode and cathode of the diode D102 in the constant voltage generating circuit 10, the circuit suffers less change to its characteristics due to change of temperature. This provides a power supply and amplifying circuits which can sufficiently be compensated for with regard to temperature.

In addition, the constant voltage generating circuit 10 which has improved temperature characteristics applies a constant voltage to the transistor TR121 of the offset voltage generating unit 12. Therefore, the offset voltage generating unit 12 may also be improved in temperature compensation.

Although this embodiment has been described as to the power supply circuit comprising the positive power supply circuit 17 and the negative power supply circuit and being used as part of the amplifying circuit, the power supply circuit of the present invention is not limited to such an arrangement. It may be similarly applied to a power supply circuit for driving a device outputting a given signal, such as a motor-driving power supply circuit or a driving power supply circuit in a TV vertical deflection circuit.

A composite integrated circuit system relating to another embodiment of the present invention will now be described with reference to the drawings. The composite integrated circuit system comprises a power supply circuit and an amplifying circuit as described in connection with the previous embodiment.

Figure 14:
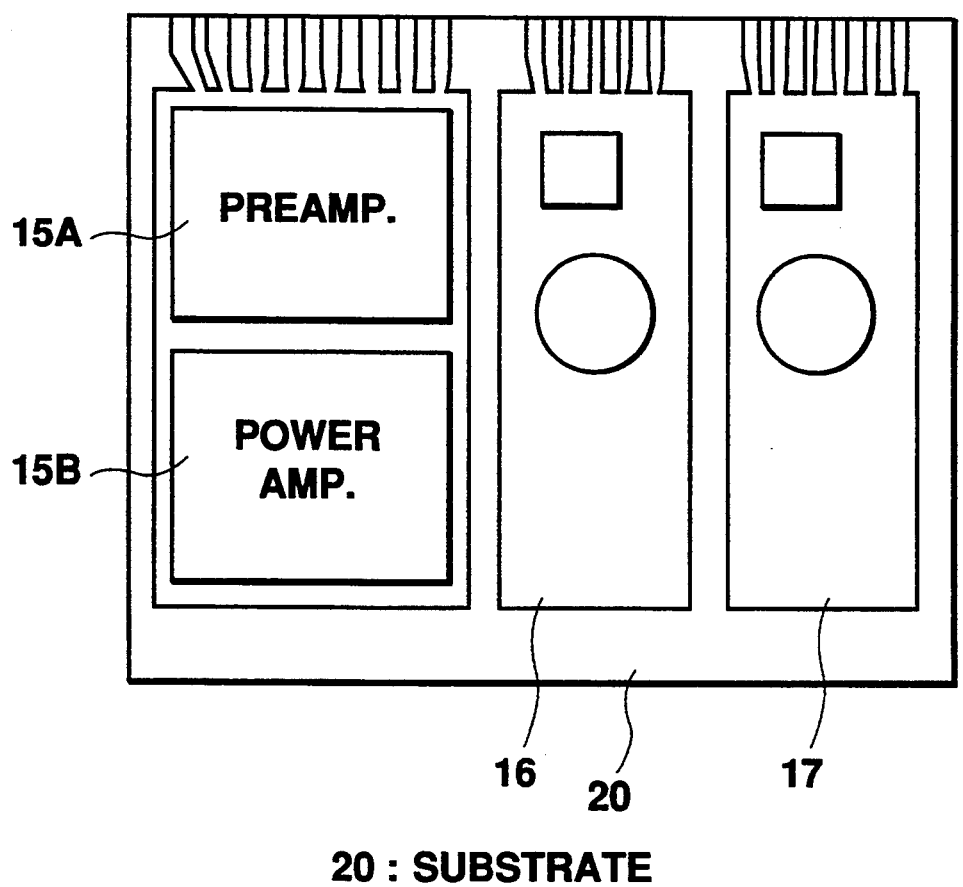
FIG. 14 is a schematical block diagram of a composite integrated circuit according to the present invention.

As shown in FIG. 14, the composite integrated circuit system comprises a positive power supply circuit 17, a negative power supply circuit 16, a preamplifier 15A and a power amplifier 15B, all of which are mounted on a support substrate 20 and have been described in the first embodiment of the present invention. The area in which the positive and negative power supply circuits 17 and 16 are disposed is separated from another area in which the preamplifier 15A and power amplifier 15B are disposed.

Since the composite integrated circuit system includes such an amplifying circuit as described in the first embodiment of the present invention, a hybrid IC having a high-frequency amplifying circuit can be provided.

Since the area in which the positive and negative power supply circuits 17 and 16 are disposed is separated from the other area in which the preamplifier 15A and power amplifier 15B are disposed, this embodiment can prevent, to the utmost, the preamplifier 15A and power amplifier 15B from being adversely affected by the noise which tends to be produced by the choke coils L151 and L251 in the positive and negative power supply circuits 17 and 16.

Although the present invention has just been described as to the composite integrated circuit system, the present invention is not limited to such a composite integrated circuit system. It may be similarly applied to a composite integrated circuit system in which only the power supply circuit, comprising the positive and negative power supply circuits 17 and 16 is mounted. This can also provide a hybrid IC having a power supply circuit which is improved in efficiency.

Such a composite integrated circuit system has an improved flexibility since it may also be applied to a power supply circuit for driving a device outputting a given signal, such as a motor-driving power supply circuit or a driving power supply circuit in a TV vertical deflection circuit.

What is claimed is:

1. A power supply circuit for supplying a supply voltage to a driven circuit, comprising:
   (a) a gradient detecting unit for detecting a gradient in an output of said driven circuit;
   (b) an offset voltage generating unit responsive to the gradient detected by said gradient detecting unit and also to the output of said driven circuit for generating an offset voltage; and
   (c) a voltage supply unit for supplying a supply voltage to said driven circuit, wherein the supply voltage is determined based on the offset voltage generated by said offset voltage generating unit.

2. A power supply circuit as defined in claim 1 wherein said gradient detecting unit differentiates the output of the driven circuit to detect the gradient therein.

3. A power supply circuit as defined in claim 1 wherein said voltage supply unit comprises:
   a comparator for comparing the offset voltage with the supply voltage; and
   a chopper circuit controlled by the output of the comparator for outputting a supply voltage to the driven circuit and to the comparator.

4. A power supply circuit as defined in claim 3, further comprising:
   a first attenuator disposed in an input path from the output of said driven circuit to said offset voltage generating unit, said first attenuator being operative to attenuate the output of said driven circuit; and
   a second attenuator disposed in an input path of supply voltage to said comparator, said second attenuator being operative to attenuate the supply voltage inputted into the comparator.

5. A power supply circuit as defined in claim 4 wherein said gradient detecting unit differentiates the output of the driven circuit to detect the gradient therein.

6. A power supply circuit as defined in claim 1 wherein the gradient detected by said gradient detecting unit is a processing signal variable in phase depending on the frequency of the output signal from the driven circuit, said processing signal being supplied to said offset voltage generating unit and wherein an offset voltage is generated from the sum of the processing signal, the output signal of the driven circuit and a given low voltage.

7. A power supply circuit as defined in claim 6 wherein said gradient detecting unit comprises a differentiating circuit comprising a capacitor of capacitance C and a resistor of resistance R which are connected in series with each other, said differentiating circuit having $f=1/(2\pi RC)$, the value f being set within a range from 0.5 times to 2 times higher than the maximum frequency in the output signal of said driven circuit, whereby in addition to detection of the gradient, a processing signal can be provided which has a variable phase depending on the frequency in the output signal of the driven circuit.

8. An amplifier comprising:
   (a) a signal amplifying unit for amplifying an input signal to form an amplified signal to be outputted therefrom;
   (b) a gradient detecting unit for detecting a gradient in said amplified signal;
   (c) an offset voltage generating unit for generating an offset voltage from the gradient detected by said gradient detecting unit and the output of said Signal amplifying unit; and
   (d) a voltage supply unit for supplying a supply voltage to said signal amplifying unit, wherein the supply voltage is determined based on the offset voltage generated by said offset voltage generating unit.

9. The amplifier as defined in claim 8 wherein said gradient detecting unit differentiates the output of the signal amplifying unit to detect the gradient therein.

10. The amplifier as defined in claim 8 wherein said voltage supply unit comprises:
    a comparator for comparing said offset voltage with said supply voltage; and
    a chopper circuit controlled by an output of said comparator for outputting a supply voltage to said signal amplifying unit and to said comparator.

11. The amplifier as defined in claim 10, further comprising:
    a first attenuator disposed in an input path from the output of said signal amplifying unit to said offset voltage generating unit, said first attenuator being operative to attenuate the output of said signal amplifying unit; and
    a second attenuator disposed in an input path of supply voltage to said comparator, said second attenuator being operative to attenuate the supply voltage inputted into the comparator.

12. The amplifier as defined in claim 11 wherein said gradient detecting unit differentiates the output of the signal amplifying unit to detect the gradient therein.

13. The amplifier as defined in claim 10 wherein said gradient detecting unit varies the phase of the gradient detection output to form a processing signal depending on the frequency of the output signal from the signal amplifying unit, said processing signal being supplied to said offset voltage generating unit which in turn adds the processing signal, the output of the signal amplifying unit and a given low voltage to generate an offset voltage.

14. The amplifier as defined in claim 13 wherein said gradient detecting unit comprises a differentiating circuit comprising a capacitor of capacitance C and a resistor of resistance R which are connected in series with each other, said differentiating circuit having $f=1/(2\pi RC)$, the value f being set within a range from 0.5 times to 2 times higher than the maximum frequency in the output signal of said signal amplifying unit, whereby in addition to detection of the gradient, a processing signal can be provided which has a variable phase depending on the frequency in the output signal of the signal amplifying unit.

15. A composite integrated circuit system having a driven circuit and a power supply circuit for supplying a supply voltage to said driven circuit, said power supply circuit comprising:

(a) a gradient detecting unit for detecting a gradient in an output of said driven circuit;
(b) an offset voltage generating unit responsive to the gradient detected by said gradient detecting unit and also to the output of said driven circuit for generating an offset voltage; and
(c) a voltage supply unit for supplying a supply voltage to said driven circuit, wherein the supply voltage is determined based on the offset voltage generated by said offset voltage generating unit.

16. A composite integrated circuit system as defined in claim 15 wherein said driven circuit is an amplifying circuit for amplifying an input signal and outputting an amplified signal.

* * * * *